(12) United States Patent
Kharma et al.

(10) Patent No.: US 8,659,119 B2
(45) Date of Patent: Feb. 25, 2014

(54) ELECTRONIC COMPONENTS ON TRENCHED SUBSTRATES AND METHOD OF FORMING SAME

(75) Inventors: Vijayeshwar D. Kharma, Millwood, NY (US); Jennifer V. Muncy, Ridgefield, CT (US); Arun Sharma, New Rochelle, NY (US); Sri M. Sri-Jayantha, Ossining, NY (US); Lorenzo Valdevit, Ithaca, NY (US); David Questad, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 617 days.

(21) Appl. No.: 12/783,787

(22) Filed: May 20, 2010

(65) Prior Publication Data

US 2010/0276784 A1    Nov. 4, 2010

Related U.S. Application Data (63) Continuation of application No. 12/099,381, filed on Apr. 8, 2008, now Pat. No. 7,855,430, which is a continuation of application No. 12/030,274, filed on Feb. 13, 2008, now Pat. No. 7,732,894, which is a continuation of application No. 11/679,407, filed on Feb. 27, 2007, now abandoned.

(51) Int. Cl.
*H01L 27/01*    (2006.01)

(52) U.S. Cl.
USPC ........... 257/532; 361/734; 361/766; 361/782; 361/810; 361/811

(58) Field of Classification Search
USPC ........... 257/532; 361/766, 782, 734, 810, 811
See application file for complete search history.

(56) References Cited

U.S. PATENT DOCUMENTS

| | | | |
|---|---|---|---|
| 5,739,186 A | 4/1998 | Hayakawa et al. | |
| 6,498,062 B2 * | 12/2002 | Durcan et al. | 438/246 |
| 6,556,453 B2 * | 4/2003 | Figueroa et al. | 361/763 |
| 6,844,591 B1 * | 1/2005 | Tran | 257/330 |
| 6,939,737 B2 | 9/2005 | Palanisamy | |
| 6,989,995 B2 * | 1/2006 | Ito | 361/811 |
| 7,286,368 B2 * | 10/2007 | Zhong et al. | 361/782 |
| 7,573,722 B2 * | 8/2009 | Tsai et al. | 361/760 |
| 7,732,894 B2 * | 6/2010 | Questad et al. | 257/532 |
| 7,777,301 B2 * | 8/2010 | Questad et al. | 257/532 |
| 7,855,430 B2 * | 12/2010 | Questad et al. | 257/532 |
| 8,054,630 B2 * | 11/2011 | Questad et al. | 361/720 |
| 2002/0027763 A1 | 3/2002 | Schaper | |
| 2002/0071256 A1 | 6/2002 | Figueroa et al. | |
| 2002/0145197 A1 | 10/2002 | Ohta et al. | |
| 2003/0219956 A1 | 11/2003 | Mori et al. | |
| 2004/0021197 A1 | 2/2004 | Oh et al. | |
| 2004/0022038 A1 | 2/2004 | Figueroa et al. | |
| 2005/0057718 A1 | 3/2005 | Chen et al. | |

(Continued)

FOREIGN PATENT DOCUMENTS

DE    195 40 814 A1    5/1997

*Primary Examiner* — Zandra Smith
*Assistant Examiner* — Toniae Thomas
(74) *Attorney, Agent, or Firm* — Vazken Alexanian; McGinn IP Law Group, PLLC (57) ABSTRACT

An electronic module including a substrate having at least one structure that reduces stress flow through the substrate, wherein the structure comprises at least one trench in a surface of the substrate.

20 Claims, 10 Drawing Sheets

(56) References Cited

U.S. PATENT DOCUMENTS

| | | | |
|---|---|---|---|
| 2006/0091564 A1* | 5/2006 | Zhong et al. | 257/784 |
| 2008/0303075 A1* | 12/2008 | Setokubo | 257/296 |
| 2009/0108458 A1* | 4/2009 | Gogoi | 257/773 |
| 2010/0230776 A1* | 9/2010 | Gogoi | 257/528 |

\* cited by examiner

ELECTRONIC COMPONENTS ON TRENCHED SUBSTRATES AND METHOD OF FORMING SAME

The present Application is a Continuation Application of U.S. patent application Ser. No. 12/099,381, filed on Apr. 8, 2008 now U.S. Pat. No. 7,855,430, which is a Continuation Application of U.S. patent application Ser. No. 12/030,274 filed on Feb. 13, 2008 now U.S. Pat. No. 7,732,894, which is a Continuation Application of U.S. patent application Ser. No. 11/679,407 filed on Feb. 27, 2007 now abandoned.

BACKGROUND OF THE INVENTION

1. Field of the Invention

The present invention generally relates to a method and apparatus for surface-mounting capacitors on electronic (organic) substrates, and more particularly to a method and apparatus for reducing strain in a surface-mounted component.

2. Description of the Related Art

Figure 1A:
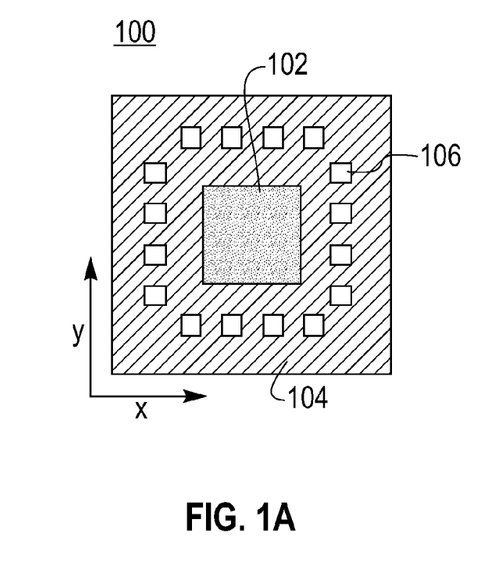
FIGS. 1A and 1B illustrate an electronic module 100 including a surface-mounted capacitor 106 mounted according to a conventional mounting technique.

Electronic components, such as capacitors, are typically mounted on a substrate. For example, as illustrated in FIG. 1A, a chip 102 is mounted on a surface of a substrate 104. A plurality of capacitors 106, or other discrete electronic devices, is mounted on the surface of the substrate 104, surrounding the chip 102.

Figure 1B:
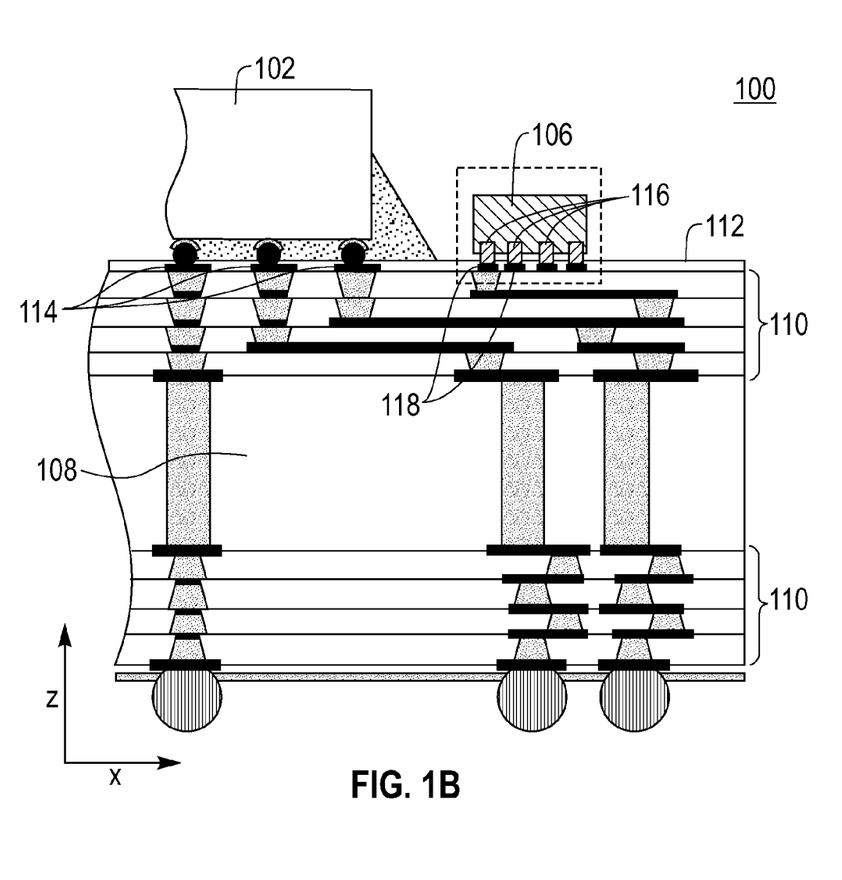

FIG. 1B illustrates a detailed description of the electronic module 100, depicted in FIG. 1A.

Typically, the substrate 104 is formed by first forming the core 108. An entire thickness of the substrate 104 may typically be, approximately 1 mm thick. Next, build-up layers 110 are formed on each of a top surface and a bottom surface of the core 108. The build-up layers typically include polymer and copper layers.

A solder mask 112 is then formed on a surface of the substrate 104. The solder mask 112 covers the substrate, except areas where it is desired to make a solder connection.

The chip (e.g., silicon chip) 102 is mounted to the substrate 104 through solder joints 114. Similarly, the capacitor 106, or other surface mount component, is mounted to the substrate by solder joints 116 and pads 118.

Capacitors that are mounted on a substrate, in accordance with the above description, however, may undergo significant thermomechanical strain. Temperature cycling produces fatigue of the solder joints or cracks in the ceramic plates of the capacitor. Accordingly, the life of the electronic package is reduced.

Figure 2:
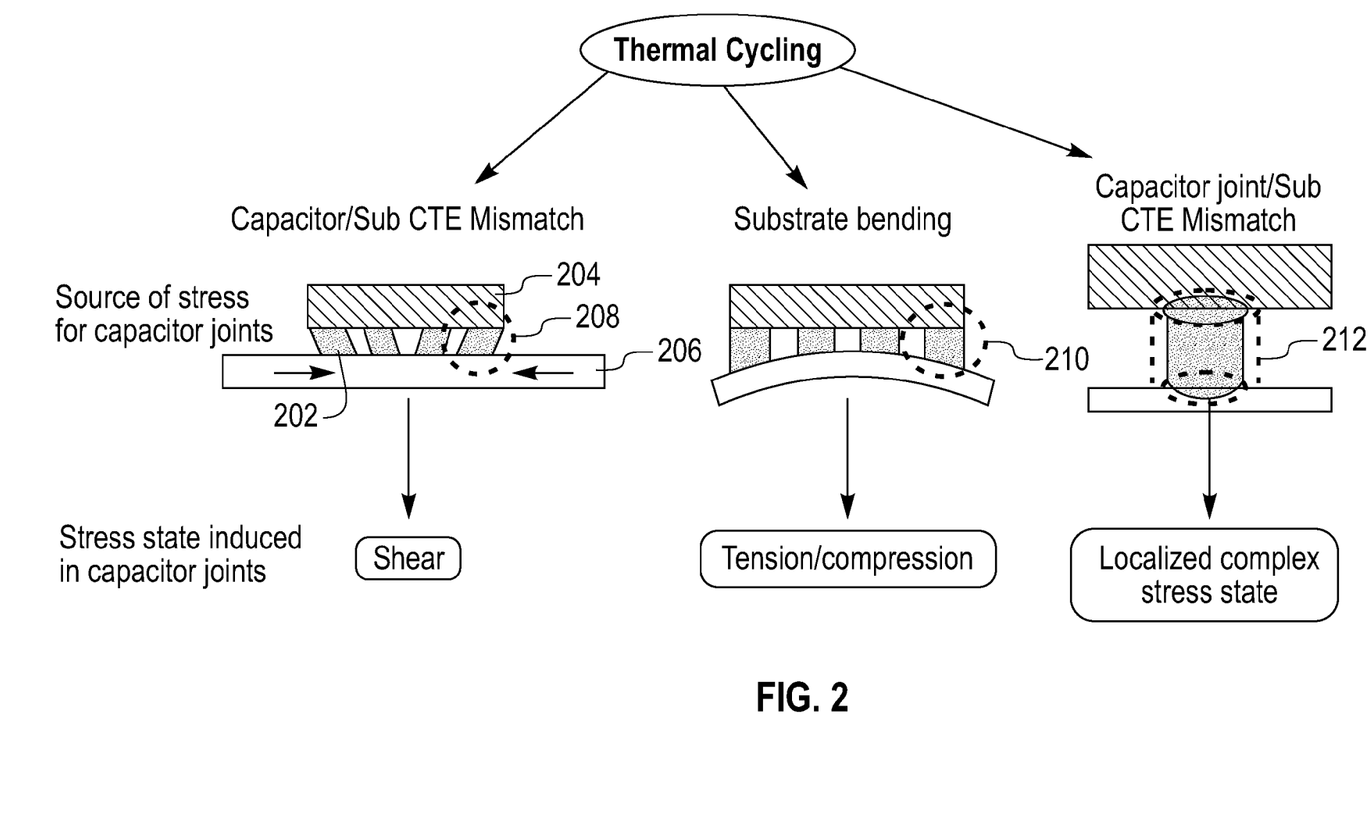
FIG. 2 illustrates typical stresses induced in solder joints 202 of a conventional surface-mounted capacitor 204.

The electronic module is subjected to thermal cycling to evaluate the robustness of the electronic joints. FIG. 2 illustrates the sources of strain on a surface-mounted component during the thermal cycling.

First, shear stress 208 is induced in the solder joints 202, which mount the capacitor 204 to the substrate 206. The shear stress on the solder joints 202 is caused by a mismatch in coefficient of thermal expansion of the capacitor 204 and the substrate 206. Typically, the coefficient of thermal expansion for the capacitor 204 may be on the order of approximately 3 ppm, while the coefficient of thermal expansion of the substrate 206 may be on the order of approximately 20 ppm.

Figure 3:
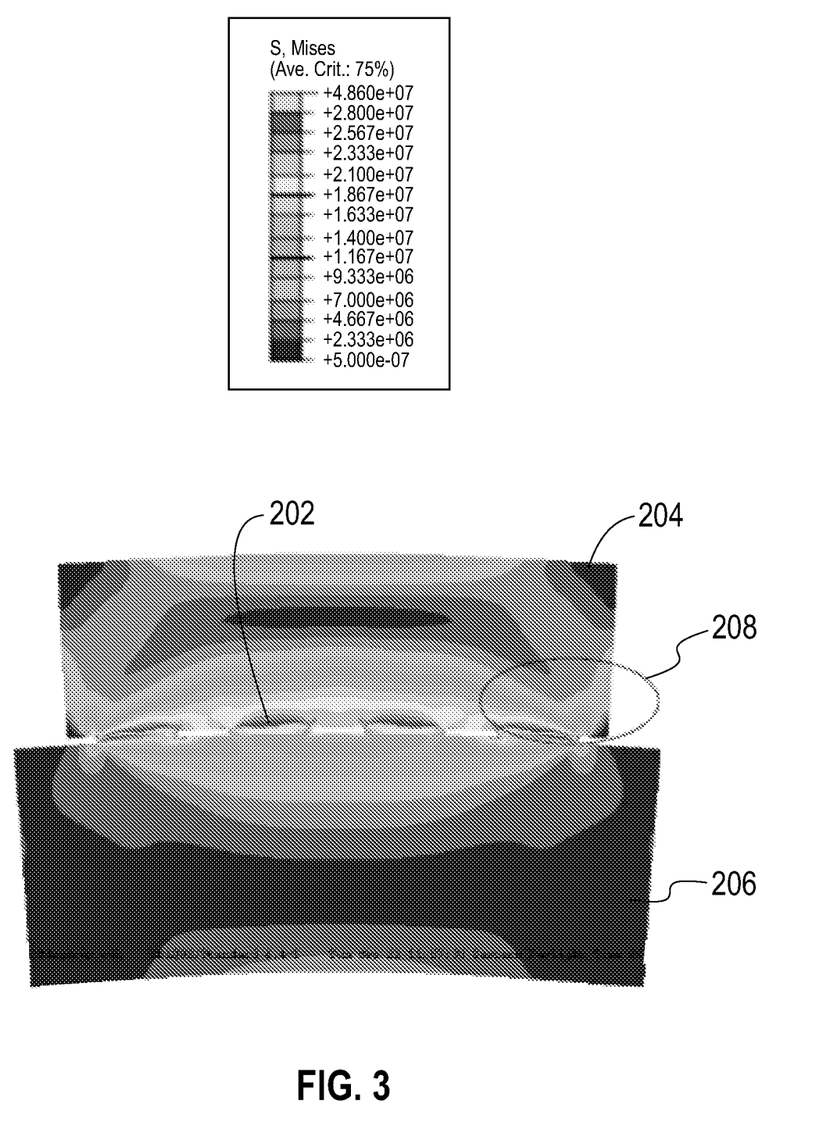
FIG. 3 further illustrates the stress induced on a conventional surface-mounted capacitor.

FIG. 3 illustrates the degree of stress 208 on the solder joints 202, the capacitor 204 and the substrate 206. The stress may also produce cracks in the substrate 206.

Figure 4:
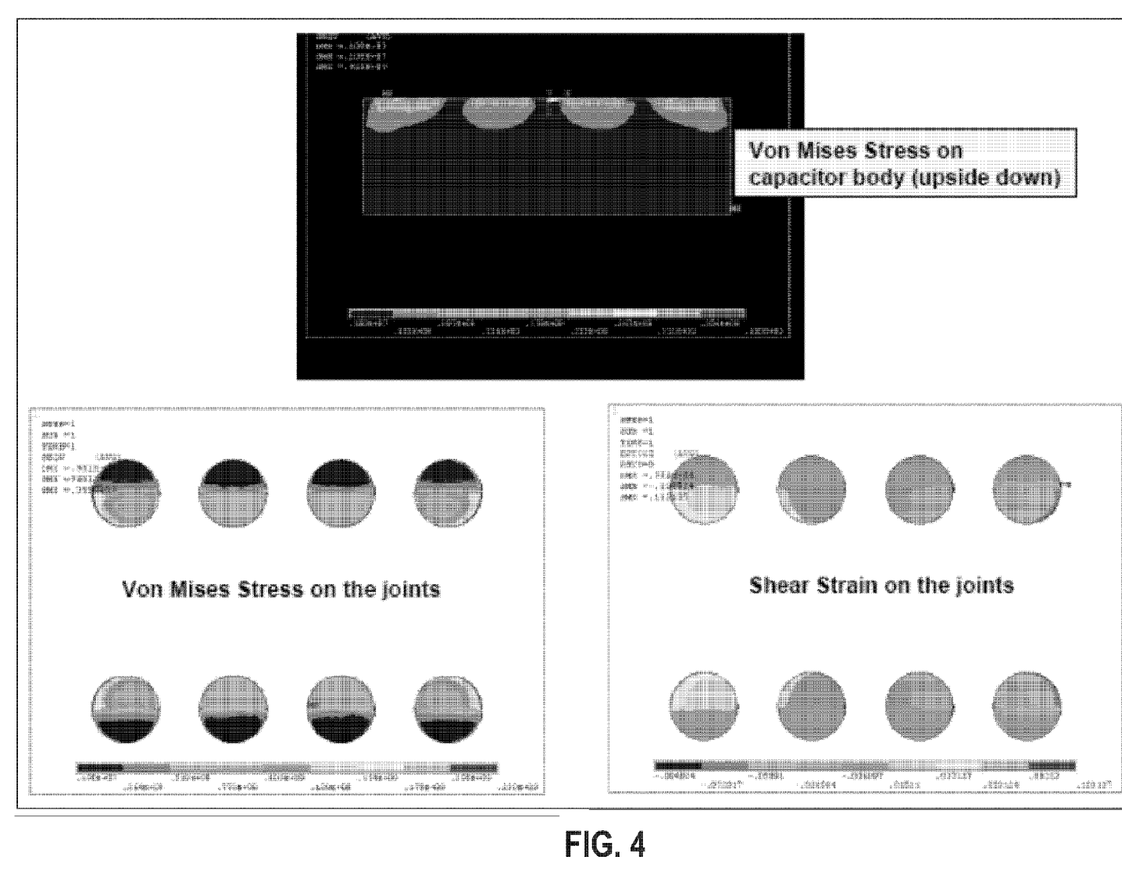
FIG. 4 further illustrates the stress induced on a conventional surface-mounted capacitor.

FIG. 4 illustrates two types of strain induced on the solder joints during thermal cycling. Both Von Mises stress and shear strain are induced on the solder joints.

Returning to FIG. 2, the mismatch in coefficient of thermal expansion also causes the substrate 206 to bend. The bending of the substrate 206 produces a tension/compression stress 210 on the solder joints 202. Additionally, while the bending may reduce the shear stress 208 on the solder joints 202, it will cause an increase in the stress placed on the capacitor 204.

Furthermore, the solder joints 202 have a coefficient of thermal expansion, which may be different from the coefficient of thermal expansion of the capacitor 204 and/or the substrate 206. This mismatch in coefficient of thermal expansion causes a localized, complex stress state 212 on the solder joints 202.

Additionally, the stress at the solder joint areas permeates the body of the electronic components, which can produce cracks that may result in functional failure.

Accordingly, prior to the present invention, there has been no method of surface mounting an electronic component, such as a capacitor, onto a substrate while reducing the effects of stress on the joints, the capacitor and the substrate.

SUMMARY OF THE INVENTION

In view of the foregoing and other exemplary problems, drawbacks, and disadvantages of the conventional methods and structures, an exemplary feature of the present invention is to provide a method and structure in which strain is reduced in a surface-mounted electronic component.

In accordance with a first aspect of the present invention, a method of mounting an electronic component on a substrate includes forming at least one trench in a surface of the substrate.

In accordance with a second aspect of the present invention, an electronic module includes a substrate having at least one trench formed in a surface of the substrate.

In accordance with a third aspect of the present invention, an electronic substrate includes at least one trench in a surface of the electronic substrate.

Forming trenches in a surface of the electronic substrate reduces the stiffness of the substrate in the vicinity of a capacitor (or any other electronic component), so that the substrate has less resistance to shear. Accordingly, the strain on the joints, which mount the electronic component onto the substrate, is reduced, which enhances the life of the joints.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Referring now to the drawings, and more particularly to FIGS. 5-10, there are shown exemplary embodiments of the method and structures according to the present invention.

Figure 5:
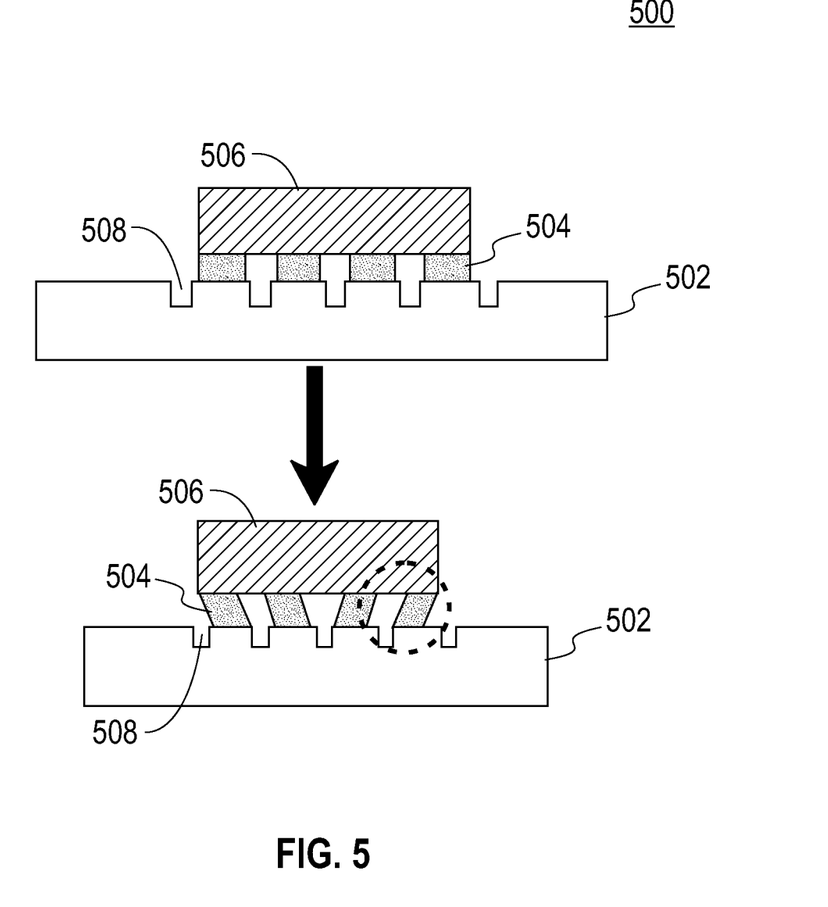
FIG. 5 illustrates an exemplary trenched substrate 502 in accordance with an exemplary embodiment of the present invention.

FIG. 5 illustrates an exemplary electronic module 500 in accordance with an exemplary embodiment of the present invention. The electronic module includes a substrate 502 having an electronic component (e.g., capacitor) 506 mounted on a surface of the substrate 502. The capacitor 506 is mounted on the substrate 502 through joints (e.g., solder joints) 504.

In accordance with certain exemplary aspects of the present invention, at least one trench 508 is formed in a surface of the substrate 502. By forming a trench 508 in a surface of the substrate 502, a stiffness of the substrate 502 is reduced. Reducing the stiffness of the substrate 502 reduces the substrate's 502 resistance to shear forces. Accordingly, the stress induced on the substrate 502 and the solder joints 504 is reduced. Therefore, the life of the solder joints 504 is enhanced.

Figure 6:
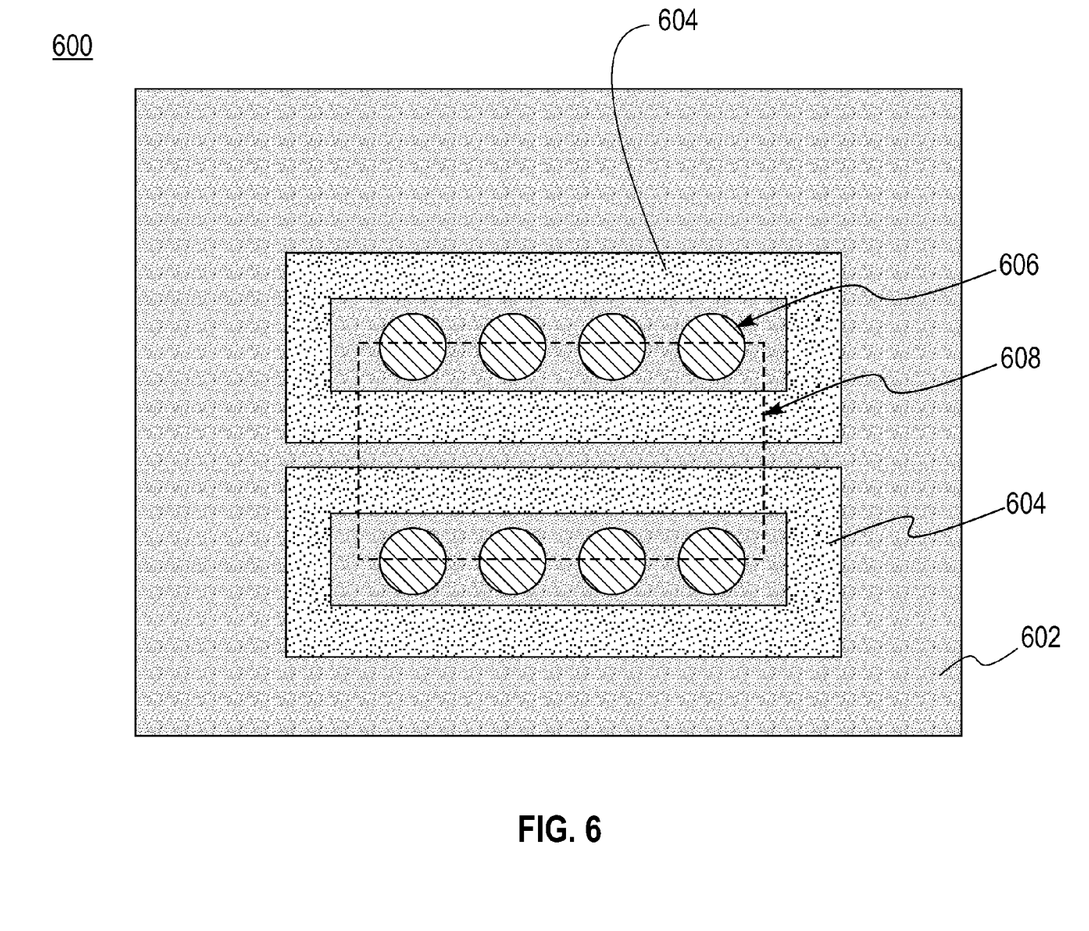
FIG. 6 illustrates a first trench design in accordance with an exemplary embodiment of the present invention.
Figure 7:
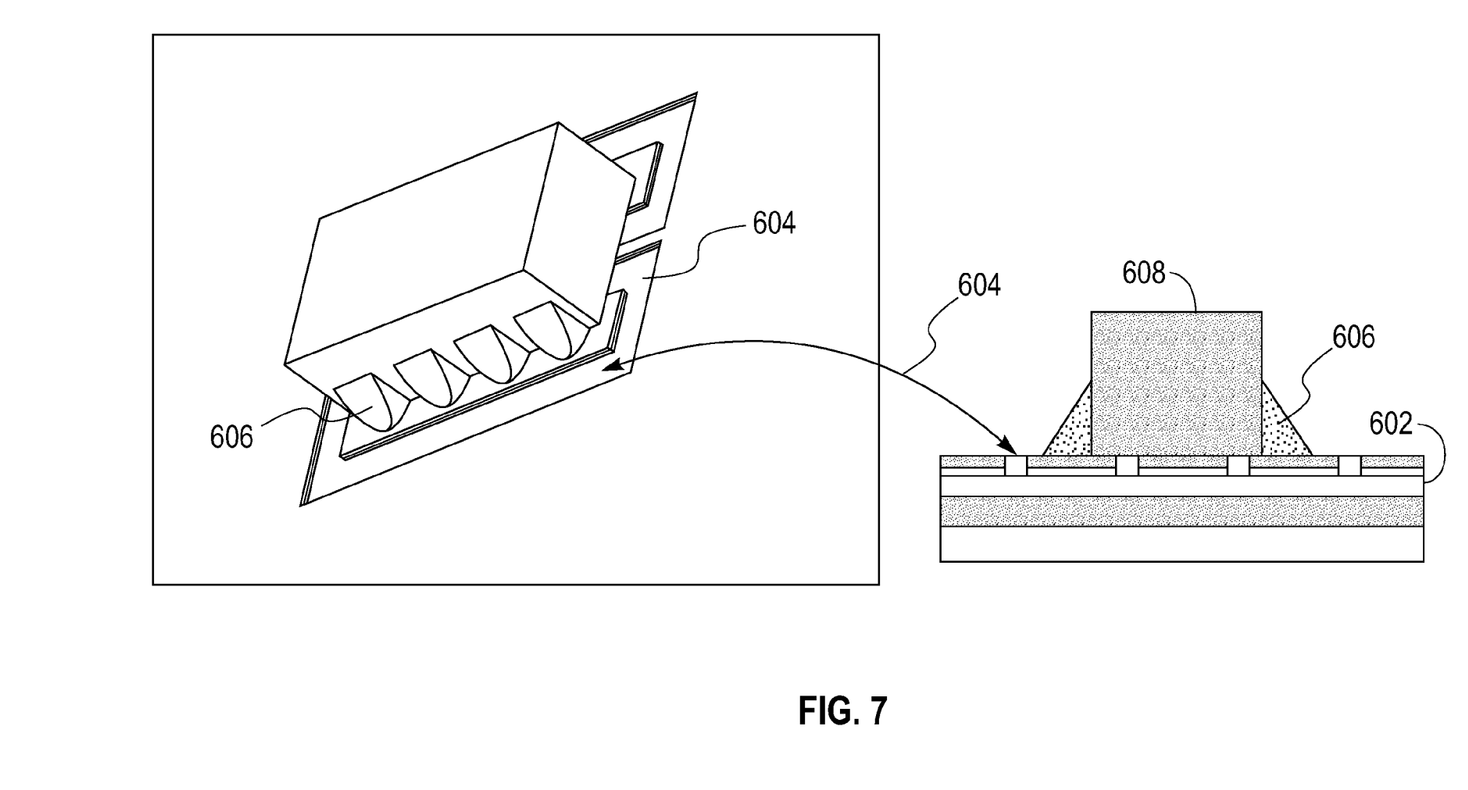
FIG. 7 illustrates a three-dimensional view of the trench design depicted in FIG. 6.

FIG. 6 illustrates a trench design in accordance with an exemplary embodiment of the present invention. FIG. 7 illustrates a three-dimensional view of the electronic module illustrated in FIG. 6.

As shown in FIG. 6, an electronic module 600 includes an electronic component (capacitor) 608 mounted on a substrate 602. The capacitor 608 is mounted to the substrate 602 by a plurality of capacitor legs (solder pads/solder joints) 606.

In accordance with the exemplary embodiment depicted in FIG. 6, the capacitor 608 is mounted to the substrate 602 by two rows of solder pads 606. A continuous trench 604 is formed around each row of solder pads 606. Each individual trench is approximately 15 µm deep and is approximately 200 µm wide.

Figure 8:
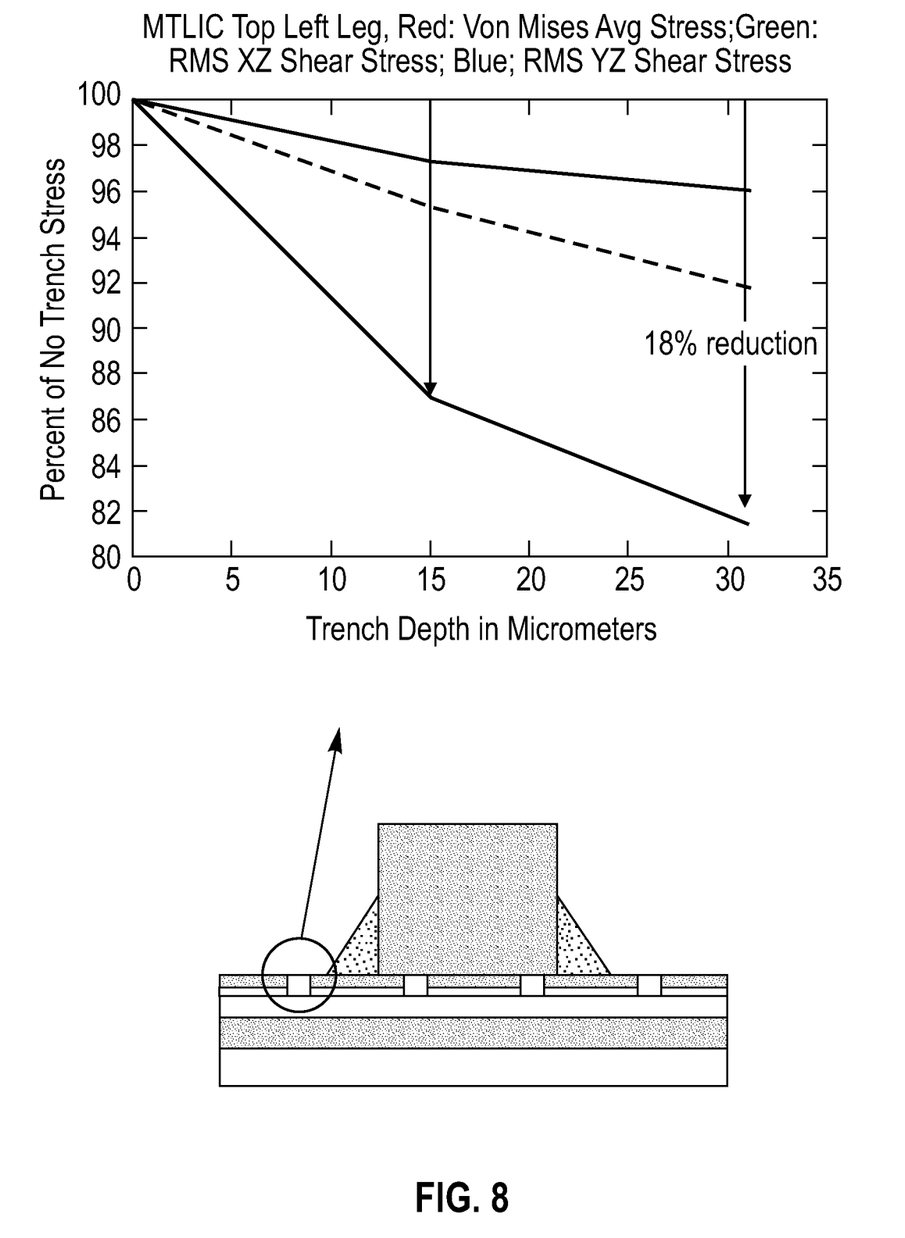
FIG. 8 graphically depicts the stress reduction resulting from the trenched substrate of the present invention.

FIG. 8 is a graph depicting the reduction in stress achieved using the trench design illustrated in FIGS. 6 and 7. As indicated in FIG. 8, the trench design depicted in FIGS. 6 and 7 provides an 18% reduction stress.

Figure 9:
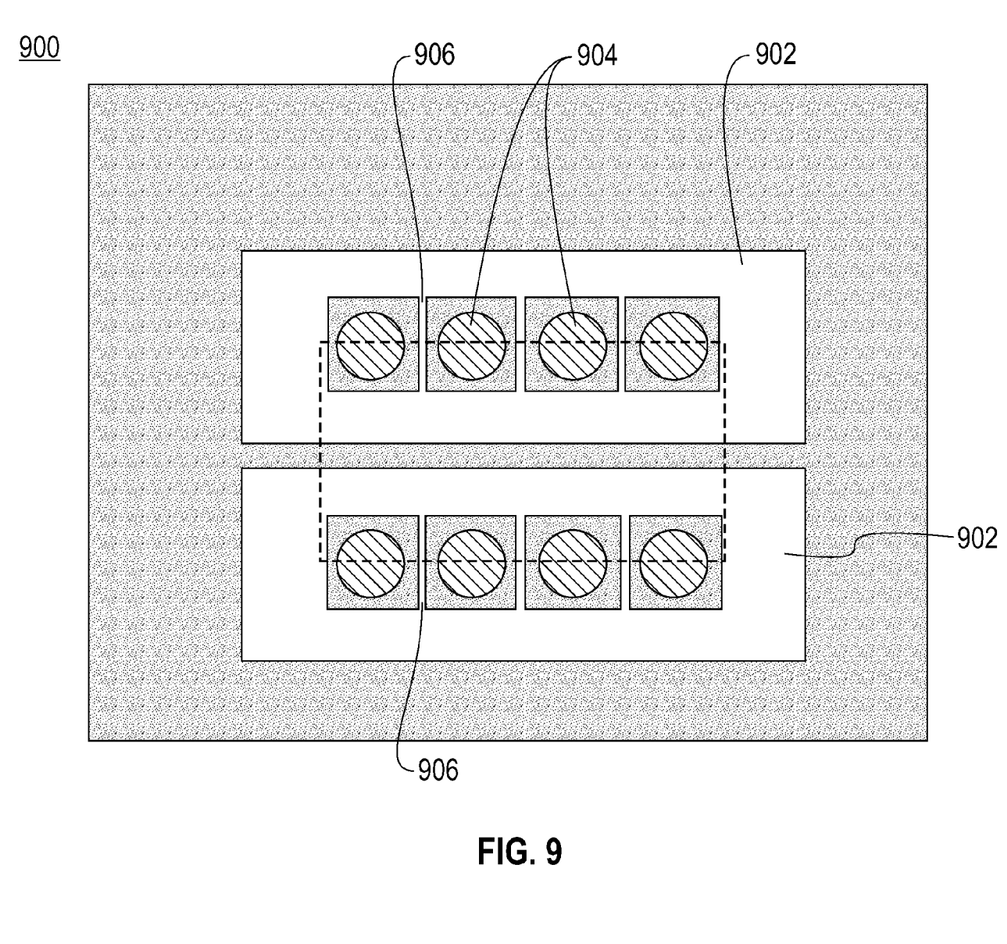
FIG. 9 illustrates a second trench design in accordance with an exemplary embodiment of the present invention.

FIG. 9 illustrates an alternative trench design in accordance with certain exemplary embodiments of the present invention. The trench design depicted in FIG. 9 also includes a continuous trench 902 formed around each row of solder joints 904. Additionally, the trench 902 includes trench extension slits 906 formed between each of the solder joints 904. The trench extension slits 906 further reduce the stiffness of the substrate, thus, further reducing the stress on the solder joints 904.

Figure 10:
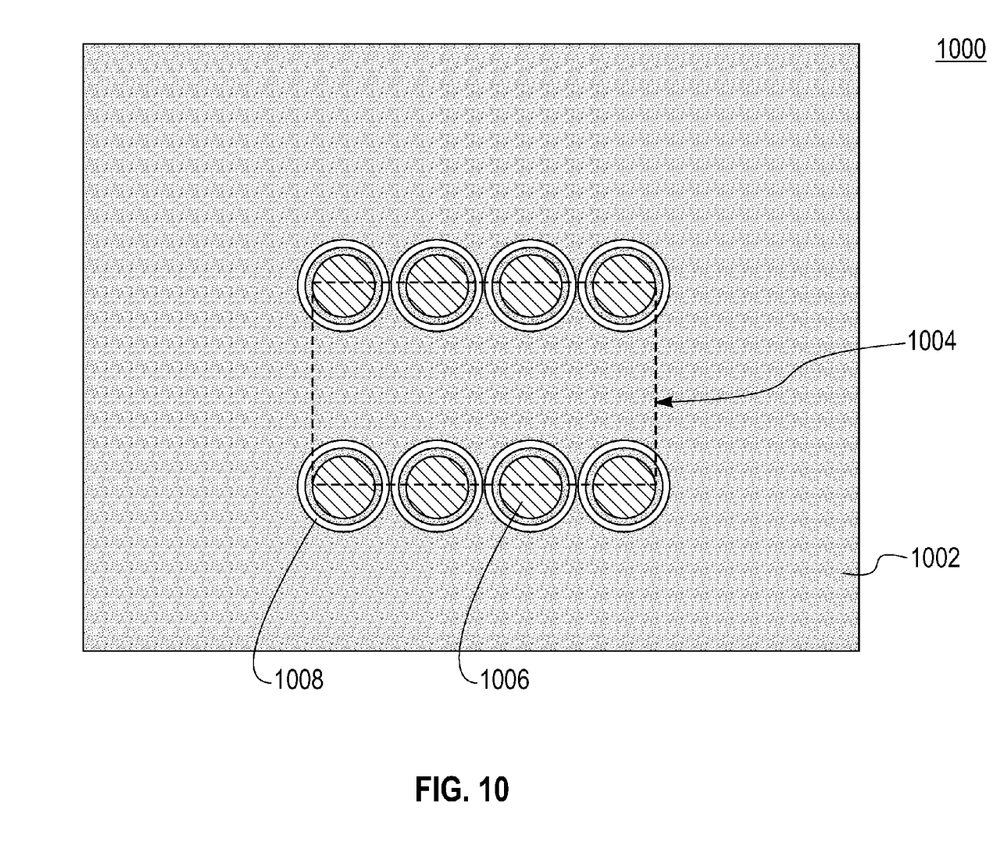
FIG. 10 illustrates a third trench design in accordance with an exemplary embodiment of the present invention.

FIG. 10 illustrates another alternative embodiment of the present invention. Similarly to the embodiments described above, the electronic module 1000 includes a capacitor 1004 mounted to a substrate 1002 by a plurality of capacitor legs 1006. In accordance with the present embodiment, an individual trench 1008 is formed around each of the individual capacitor legs 1006. The trenches 1008 have a shape similar to the shape of the capacitor legs. In the embodiment illustrated in FIG. 10, the trenches have a circular shape.

While the invention has been described in terms of several exemplary embodiments, those skilled in the art will recognize that the invention can be practiced with modification within the spirit and scope of the appended claims.

Further, it is noted that, Applicants' intent is to encompass equivalents of all claim elements, even if amended later during prosecution.

What is claimed is:

1. An electronic module, comprising:
    a substrate comprising at least one structure that reduces stress flow through the substrate,
        wherein said structure comprises a plurality of trenches extending from an uppermost surface of the substrate through the substrate; and
    a plurality of capacitor legs disposed on the uppermost surface of the substrate; said trenches reducing stress on the capacitor legs.

2. The electronic module in accordance with claim 1, wherein said trenches are formed around the plurality of capacitor legs, said capacitor legs mounting an electronic component to the substrate.

3. The electronic module in accordance with claim 2, wherein at least one trench of said trenches comprises a continuous trench.

4. The electronic module in accordance with claim 1, wherein said trenches comprise:
    a first trench formed around a first row of the capacitor legs; and
    a second trench formed around a second row of the capacitor legs.

5. The electronic module in accordance with claim 1, wherein said plurality of trenches comprises a plurality of continuous trenches formed around the plurality of capacitor legs.

6. The electronic module in accordance with claim 1, wherein said plurality of trenches comprises a plurality of individual trenches, said individual trenches being formed around the plurality of capacitor legs.

7. The electronic module in accordance with claim 1, wherein the surface comprises the uppermost surface of the substrate.

8. The electronic module in accordance with claim 1, wherein the surface comprises a surface on which an electronic component is mounted.

9. The electronic module in accordance with claim 1, wherein said plurality of trenches is formed around the plurality of capacitor legs.

10. The electronic module in accordance with claim 1, wherein said trenches are formed in the uppermost surface of the substrate around each of the plurality of capacitor legs.

11. The electronic module according to claim 1, further comprising an electronic component mounted above the substrate, the electronic component being mounted by a first row of the capacitor legs and a second row of the capacitor legs, wherein the trenches are formed around the first row of the capacitor legs and the second row of the capacitor legs.

12. The electronic module in accordance with claim 1, wherein the capacitor legs are disposed on a surface of an electronic component that extends above the trenches.

13. The electronic module in accordance with claim 1, wherein an upper surface of each of the capacitor legs is disposed on a surface of an electronic component that continuously extends above the trenches.

14. The electronic module in accordance with claim 1, wherein the trenches are formed around a first row and a second row of the capacitor legs.

15. An electronic module, comprising:
a substrate;
an electronic component mounted above the substrate;
a plurality of capacitor legs disposed on an uppermost surface of the substrate, the plurality of capacitor legs mounting the electronic component above the substrate; and
at least one trench formed around the plurality of capacitor legs,
wherein the at least one trench comprises one of a plurality of trenches.

16. The electronic module according to claim 15, wherein the plurality of capacitor legs comprises a first row of capacitor legs and a second row of capacitor legs, and
wherein the plurality of trenches comprises a first trench formed around the first row of capacitor legs and a second trench formed around a second row of capacitor legs.

17. The electronic module according to claim 15, wherein the trenches comprise:
a first trench formed around a first row of the capacitor legs; and
a second trench formed around a second row of the capacitor legs.

18. The electronic module according to claim 15, wherein said plurality of trenches comprises a plurality of individual trenches, said individual trenches being formed around the plurality of capacitor legs.

19. An electronic module, comprising:
a substrate; and
at least one trench in a surface of the substrate, said at least one trench being formed around a plurality of capacitor legs disposed on an uppermost surface of the substrate, said capacitor legs mounting an electronic component to the substrate,
wherein said at least one trench comprises:
a first trench formed around a first row of the capacitor legs; and
a second trench formed around a second row of the capacitor legs.

20. The electronic module in accordance with claim 19, wherein the at least one trench further comprises a plurality of trenches.

* * * * *